United States Patent [19]

Satoh et al.

[11] Patent Number: 4,990,972
[45] Date of Patent: Feb. 5, 1991

[54] SEMICONDUCTOR LIGHT EMITTING DEVICE

[75] Inventors: Shiro Satoh, Ogawara; Noriaki Onodera, Sendai, both of Japan

[73] Assignee: Ricoh Company, Ltd., Tokyo, Japan

[21] Appl. No.: 404,868

[22] Filed: Sep. 8, 1989

[30] Foreign Application Priority Data

Sep. 14, 1988 [JP] Japan .................. 63-228483

[51] Int. Cl.$^5$ ............................ H01L 33/00
[52] U.S. Cl. ............................ 357/17; 357/60; 357/68; 372/46; 372/50; 372/92
[58] Field of Search ............ 372/46, 45, 50, 92; 357/17, 60, 65, 68

[56] References Cited

U.S. PATENT DOCUMENTS

| | | | |
|---|---|---|---|
| 4,675,875 | 6/1987 | Takamiya | 372/45 |
| 4,706,101 | 11/1987 | Nakamura et al. | 372/45 |
| 4,819,243 | 4/1989 | Opschoor | 372/45 |

Primary Examiner—James W. Davie
Attorney, Agent, or Firm—Cooper & Dunham

[57] ABSTRACT

A semiconductor light emitting device comprises a semiconductor substrate of a first conductivity type; an electric current blocking layer formed on one main face of the substrate and including a semiconductor of a second conductivity type opposite to the first conductivity type and having an opening reaching the main face; a first semiconductor layer of the first conductivity type formed on the electric current blocking layer and a portion of the main face on which the opening is disposed; a second semiconductor layer stacked on the first semiconductor layer and forming a hetero-junction together with the first semiconductor layer; a semiconductor layer for electrode of the second conductivity type formed on the second semiconductor layer and having a window reaching the second conductor layer in a position corresponding to the opening; a first electrode metallic layer formed on the electrode semiconductor layer except for the window; and a second electrode metallic layer formed on the other main face of the substrate. The window has a flat shape composed of a substantially circular or rectangular shape and has a size substantially less than the size of the opening. Portions of the first and second semiconductor layers corresponding to the opening function as a light emitting region by flowing an electric current between the first and second electrode metallic layers, and a light generated from the light emitting region is outputted through the window in a direction substantially perpendicular to the substrate.

5 Claims, 8 Drawing Sheets

WAFER PLANE (100)

WAFER PLANE (100)

WAFER PLANE (100)

WAFER PLANE (100)

SEMICONDUCTOR LIGHT EMITTING DEVICE

BACKGROUND OF THE INVENTION

The present invention relates to a semiconductor light emitting device for taking out a light emitting output in a direction substantially perpendicular to a semiconductor substrate.

In general semiconductor light emitting device, it is necessary to electrically separate light emitting elements from each other to prevent crosstalk between the adjacent elements so as to form the elements in an array. The elements are electrically separated from each other by forming a groove for separation between the elements. When such a groove is formed by wet etching, a groove having a specified face in a specified direction is formed by the anisotropy of a crystal so that the width, depth and direction of the groove cannot be independently controlled. Accordingly, such a construction is not suitable for the integration of high density with respect to the arrayed elements and the arbitrariness of design.

As mentioned above, to construct the light emitting diode suitable for a one or two-dimensional array of high density, it is necessary to provide a structure in which the size of the light emitting portion is small and a sufficient light output is obtained and the injecting efficiency of the electric current is high and the light emitting efficiency is also high. Further, such a structure must have a high mechanical strength with respect to the element. Further, it is necessary to perform the electrical separation of the elements suitable for the high density array having less crosstalk between the adjacent elements. In addition, it is preferable that the light emitting angle is small.

A compound semiconductor laser has been recently researched by various kinds of methods. A proposed compound semiconductor laser has various kinds of stripe type structures to reduce an oscillating threshold value electric current and enable the operation of the laser in a single transversal mode. For example, there is a Melt-Etched Inner Stripe (MEIS) type laser element as a laser element of an inner stripe type having a structure for concentrating the electric current within the laser element.

In this MEIS type laser element, for example, an n-GaAs buffer layer formed by a liquid phase epitaxial growing method, an n-$Al_{0.45}Ga_{0.55}As$ clad layer, an undoped $Al_{0.15}Ga_{0.85}As$ active layer, a p-$Al_{0.45}Ga_{0.55}As$ clad layer, and a p-GaAs cap layer are sequentially formed on an n-GaAs substrate. An n-GaAs layer and an n-$Al_{0.45}Ga_{0.55}As$ layer having a groove in a backward mesa shape are formed on the side of the active layer of the p-$Al_{0.45}Ga_{0.55}As$ clad layer. A p-type ohmic electrode is formed on the p-GaAs cap layer on an upper face of a stacked portion, and an n-type ohmic electrode is formed on the rear face of the substrate. In this general element structure, the n-GaAs layer and the n-$Al_{0.45}Ga_{0.55}As$ layer formed in the p-$Al_{0.45}Ga_{0.55}As$ clad layer act as a layer for concentrating the electric current thereon. In this electric current blocking layer, the n-GaAs layer is formed in an upper portion of the active layer through the p-$Al_{0.45}Ga_{0.55}As$ clad layer having a very thin thickness less than about 0.3 μm. Therefore, a layer portion except for the groove formed in the backward mesa shape constitutes a loss region to stabilize the transversal mode.

However, in such a structure, two electric current blocking layers and the p-$Al_{0.45}Ga_{0.55}As$ clad layer as an electric current channel, and the p-GaAs cap layer are stacked with each other in an upper portion of the active layer so that the entire thickness of the stacked layers approximately becomes 7 μm. When such an element is manufactured, it is necessary to etch the n-GaAs layer by meltback during the liquid phase growth so as to form the groove in the backward mesa shape. Therefore, the manufacturing process is complicated and it takes time and labor to manufacture the semiconductor light emitting device.

SUMMARY OF THE INVENTION

It is therefore an object of the present invention to provide a surface emitting type semiconductor light emitting device suitable for the integration of high density.

Another object of the present invention is to provide a semiconductor light emitting device which can be easily manufactured without using processes requiring much labor such as melt back.

The above objects of the present invention can be achieved by a semiconductor light emitting device comprising a semiconductor substrate of a first conductivity type; an electric current blocking layer formed on one main face of the substrate and including a semiconductor of a second conductivity type opposite to the first conductivity type and having an opening reaching the main face; a first semiconductor layer of the first conductivity type formed on the electric current blocking layer and a portion of the main face on which the opening is disposed; a second semiconductor layer stacked on the first semiconductor layer and forming a heterojunction together with the first semiconductor layer; a semiconductor layer for electrode of the second conductivity type formed on the second semiconductor layer and having a window reaching the second semiconductor layer in a position corresponding to the opening; a first electrode metallic layer formed on the electrode semiconductor layer except for the window; and a second electrode metallic layer formed on the other main face of the substrate. The window has a flat shape composed of a substantially circular or rectangular shape and has a size substantially less than the size of the opening. Portions of the first and second semiconductor layers corresponding to the opening function as a light emitting region by flowing an electric current between the first and second electrode metallic layers, and a light generated from the light emitting region is outputted through the window in a direction substantially perpendicular to the substrate.

Further objects and advantages of the present invention will be apparent from the following description of the preferred embodiments of the present invention as illustrated in the accompanying drawings.

DESCRIPTION OF THE PREFERRED EMBODIMENTS

The preferred embodiments of a semiconductor light emitting device of the present invention will next be described in detail with reference to the accompanying drawings.

Figure 1:
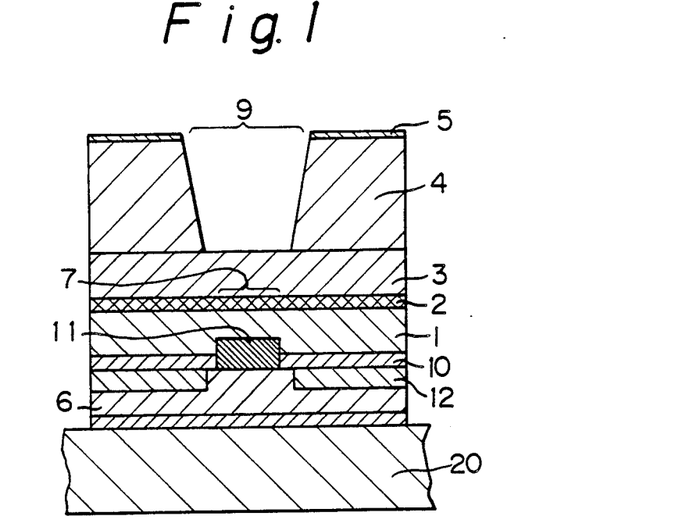
FIGS. 1 and 2 are end views showing an example of a general semiconductor light emitting device.
Figure 2:
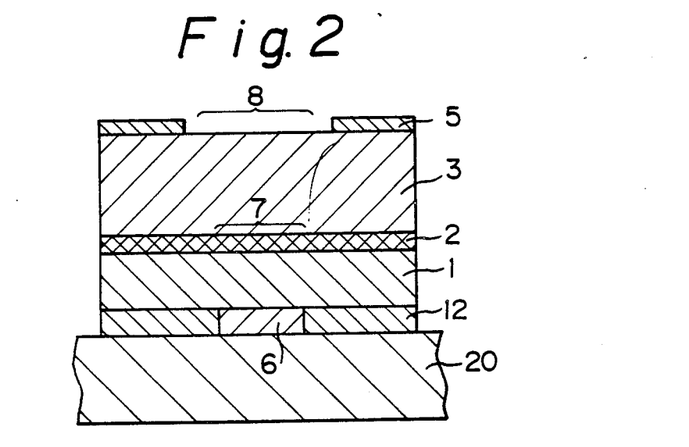

FIGS. 1 and 2 show the general construction of a light emitting diode for taking out a light emitting output in a direction perpendicular to a semiconductor substrate. The light emitting diode shown in FIG. 1 has a double hetero-junction structure. The double hetero-junction structure is constructed by a p-type AlGaAs layer 1 stacked on a n-type GaAs substrate 4, an active layer 2 composed of AlGaAs or GaAs, and an n-type AlGaAs layer 3. Further, an opening 9 reaching a layer 3 is formed in the substrate 4. An electrode 5 is formed to surround the opening 9. The active layer 2 is disposed between the layers 1 and 3 and functions as a light emitting layer. An n-type GaAs layer 10 is stacked on the layer 1 and a p-type region diffused with respect to an impurity Zn is formed in a layer portion 11 below the opening 9 of the layer 1. Further, an electrically insulating layer 12 composed of $SiO_2$ for example is disposed on a surface of the layer 10 except for the p-type region 11. An electrode 6 is formed on the insulating layer 12 and the p-type region 11. When an electric current flows between the electrodes 5 and 6, the electric current is injected or concentrated onto the region 7 by the above-mentioned construction. Thus, a light output from the region 7 can be taken upwards out of the opening 9 in a direction perpendicular to the substrate 4.

The light emitting device in FIG. 2 has the double hetero-junction in layers 1, 2 and 3. To concentrate the electric current on a light emitting portion 7 of the active layer 2, an electrode 6 is formed in a corresponding layer portion and an opening 8 is left in a layer portion corresponding to the light emitting portion 7 and the electrode 5 is formed around the opening 8. When the electric current flows between the electrodes 5 and 6, a light output is provided upwards from the opening 8 in the direction perpendicular to the substrate. The substrate is removed from the structure in FIG. 2.

In both devices in FIGS. 1 and 2, a heat sink 20 is disposed on the side of the electrode 6, and the widths of forbidden bands of the layers 1 and 3 located upwards and downwards with respect to the active layer 2 are set to be wide, and further the layer 3 is transparent with respect to a light emitting wavelength.

In the structure shown in FIG. 1, the opening 9 reaching the semiconductor layer 3 is disposed in the substrate 4 to obtain the light output on the side of the semiconductor substrate 4. Normally, the semiconductor substrate 4 is required to have at least a thickness greater than 70 $\mu$m to maintain a mechanical strength of the element. Since the opening 9 is formed by wet etching, the opening 9 has a diameter about twice at least the depth thereof so that the diameter of the opening 9 is greater than 100 $\mu$m. Therefore, when a number of elements having such a constuction are formed in an array, the distance between the adjacent elements is greater than 100 $\mu$m, which is not suitable for the integration of high density. To solve this problem, in another structure, the upward and downward directions of the element are arranged to be opposite to each other and no opening is disposed in the substrate 4 and the substrate 4 is connected to the heat sink 20 so as to obtain the light output from the side of the electrode 6. However, in such a structure, it is necessary to dispose an opening reaching the semiconductor layer 1 in a layer portion corresponding to the position of the light emitting portion 7 with respect to the electrode 6 and the semiconductor layer 10 for electrode. Therefore, the electric current flowing through the p-type region 11 from the electrode 6 is dispersed within the p-type region 11 and then reaches the electrode 5. Accordingly, the electric current is not efficiently concentrated and the light emitting efficiency is thereby reduced.

In light emitting device shown in FIG. 2, since the substrate is removed, the diameter of the opening or window 8 disposed in the electrode 5 can be reduced, but the element has a thin thickness less than several ten $\mu$m for example so that the mechanical strength of the element is low. In particular, when the element is arranged in an array, the area for chip becomes large so that mechanical distortion and deflection tend to be caused. Accordingly, such a structure is an element structure which is not suitable for the formation of the array.

Figure 3:
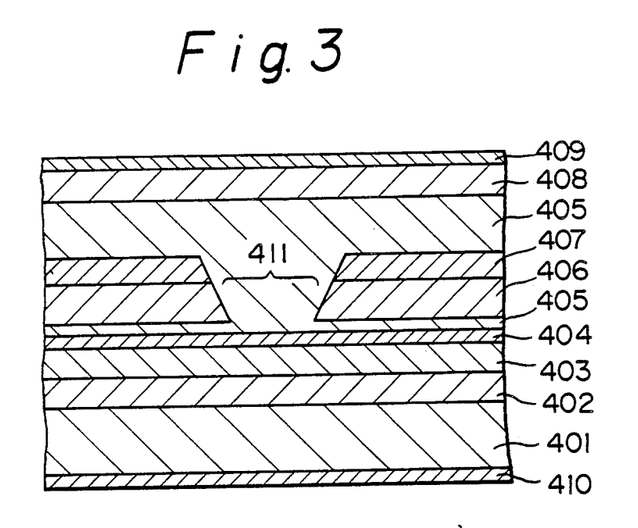
FIG. 3 is a cross-sectinal view partially showing an example of another general semiconductor light emitting device.

FIG. 3 shows an example of a general MEIS type laser element as a semiconductor light emitting element.

In the MEIS type laser element shown in FIG. 3, an n-GaAs buffer layer 402, an n-$Al_{0.45}Ga_{0.55}As$ clad layer 403, an undoped $Al_{0.15}Ga_{0.85}As$ active layer 404, a p-$Al_{0.45}Ga_{0.55}As$ clad layer 405, and an n-GaAs layer 406 are sequentially grown on an n-GaAs substrate 401 by a liquid phase epitaxial growing method. Next, a striped projecting portion in a backward mesa shape is formed in the n-GaAs layer 406. Further, an upper face of the n-GaAs layer 406 except for an upper portion of the striped projecting portion in the backward mesa shape is buried by an n-Al$_{0.45}$Ga$_{0.55}$As layer 407. Thereafter, the n-GaAs layer 406 in the mesa portion is melt-etched by a layer having the same composition as that of the p-Al$_{0.45}$Ga$_{0.55}$As clad layer 405. When a layer having the same composition as that of the p-Al$_{0.45}$Ga$_{0.55}$As clad layer 405 is stacked, the n-GaAs layer 406 in the mesa portion is removed by melt-etching, and then the p-Al$_{0.45}$Ga$_{0.55}$As layers are formed on a lower surface of the layer 406 and on an upper surface of the layer 407. Thus, a p-GaAs cap layer 408 is grown and a p-type ohmic electrode 409 is formed on an upper face of the stacked portion, thereby forming an n-type ohmic electrode 410 on the rear face of the substrate 401.

In such a structure, the n-GaAs layer 406 and the n-Al$_{0.45}$Ga$_{0.55}$As layer 407 act as a blocking layer for concentrating the electric current to the channel 411. In this electric current blocking layer, the n-GaAs layer 406 is formed through the p-Al$_{0.45}$Ga$_{0.55}$As clad layer 405 having a very thin thickness less than about 0.3 μm and formed between the n-GaAs layer 406 and the active layer 404. Therefore, a lower portion of n-GaAs blocking layer except for a channel region 411 constitutes a loss region to stabilize a transversal mode.

However, in such a structure, two electric current blocking layers and the p-Al$_{0.45}$Ga$_{0.55}$As clad layer 405 as an electric current channel, and the p-GaAs cap layer 408 are stacked with each other in an upper portion of the active layer 404 so that the entire thickness of the stacked layers approximately becomes 7 μm, thereby greatly reducing the radiation of heat. When such an element is manufactured, it is necessary to etch the n-GaAs layer 406 by melt back during the liquid phase growth so as to form the groove in the backward mesa shape. Therefore, the manufacturing process is complicated and it takes time and labor to manufacture the semiconductor light emitting device. This example of the general semiconductor light emitting device is an end-face type light emitting device.

In accordance with the construction of the semiconductor light emitting device of the present invention, the electric current blocking layer contacts and is stacked on the semiconductor substrate of a first conductivity type and is composed of a semiconductor layer of a second conductivity type. An opening is formed by wet etching in the electric current blocking layer and reaches the semiconductor substrate. For example, this opening is formed in the semiconductor substrate on a plane (100) for example by the etching processing using a mask having a substantially square opening and substantially inclined by 45° with respect to a direction [011] by photolithography. This opening has a side face having no backward mesa shape. The semiconductor layers of the first and second conductivity types are sequentially stacked with each other on the electric current blocking layer and the substrate exposed by forming the opening, thereby constituting a so-called single hetero-junction structure. Thus, a portion of this structure in the vicinity of a boundary face thereof functions as a light emitting portion.

Otherwise, a semiconductor clad layer of the first conductivity type, a semiconductor layer composed of an active layer having a forbidden band width narrower than that of this clad layer, a semiconductor clad layer of the second conductivity type approximately having the same forbidden band width as that of the semiconductor clad layer of the first conductivity type are sequentially stacked with each other on the electric current blocking layer and the substrate exposed by forming the opening. Thus, a so-called double hetero-junction structure is formed and the active layer functions as the light emitting portion.

The semiconductor electrode layer of the second conductivity type is formed on the single or double hetero-junction structure, and a portion thereof corresponding to the above opening has a second opening. The second opening reaches the semiconductor layer below the semiconductor electrode layer and functions as an optical window with respect to the light emitting output. Further, an electrode metallic layer is disposed on the semiconductor electrode layer and an electrode metallic layer is also disposed on the rear face of the substrate. When an electric current flows between both electrode layers, the electric current concentrates on the light emitting portion in a position corresponding to the opening. Thus, the light output is taken out upwards in a direction substantially perpendicular to the substrate through the window in the semiconductor electrode layer.

With respect to the substrate on azimuth plane (100), a third opening is formed in the electric current blocking layer by wet etching using an approximately square pattern substantially inclined by 45° with respect to the direction [011] and formed by photolithography. This opening has no backward mesa shape on a side face thereof. This opening is formed by a solution having a ratio of sulfuric acid: hydrogen peroxide: water = 1:8:1 at a temperature about 5° C. in the case of GaAs for example. Thus, when the semiconductor layer is epitaxially grown, this layer can be grown without any clearance in the bottom of the third opening. However, when this opening has a portion in the backward mesa shape, a clearance is caused by forming an unburied portion in the bottom of this opening. Since the side face and bottom face of the third opening are formed by wet etching, a smooth side face is obtained and a crystal face is exposed. Accordingly, the crystallization of the epitaxial layer grown on the crystal face is preferable in comparison with a face formed by dry etching.

The spot diameter of the emitted light thus obtained depends on the diameter of the opening. The light emitting efficiency is increased by the single or double hetero-junction structure. Since the electric current blocking layer is formed, the electric current is effectively concentrated on a layer portion corresponding to the opening, thereby improving the injecting efficiency of the electric current. Accordingly, such a structure also improves the light emitting efficiency. Thus, a sufficient light output is obtained even when the spot diameter of the light emitting portion is small.

In the present invention, the respective semiconductor layers are formed by a MOCVD. The MOCVD is suitable for the formation of a semiconductor layer having uniform thickness, composition, and electric and optical natures over a wide area thereof in comparison with an LPE. Therefore, the MOCVD is suitable for the formation of a structure such as an array structure in which elements are arranged in a chip having a relatively wide area. In accordance with the MOCVD, a step shape of the opening disposed in the electric current blocking layer also appears in the semiconductor layer stacked thereon while this step shape is held. However, in the case of the LPE, the semiconductor layer cannot be stacked while the step shape is held. By the MOCVD, the step shape can be held until an uppermost layer so that it is easy to form the window in the semiconductor electrode layer and form and position the electrode metallic layer by the photolithography on the semiconductor electrode layer, which is advantageous in the manufacturing process. Further, the step formed between the light emitting portion and a peripheral portion thereof restrains the light generated in the light emitting portion from being transmitted in a direction parallel to the substrate.

The angle in dispersion of the emitted light can be reduced by a structure in which the diameter of the open window in the semiconductor electrode layer is substantially equal to or smaller than the diameter of the opening formed in the electric current blocking layer. In this case, the distance between the window and the light emitting portion gives an influence to this angle. The crosstalk between the adjacent elements with respect to the emitted light is reduced by such a structure when the elements are arranged in a one or two dimensional array for example.

Figure 4:
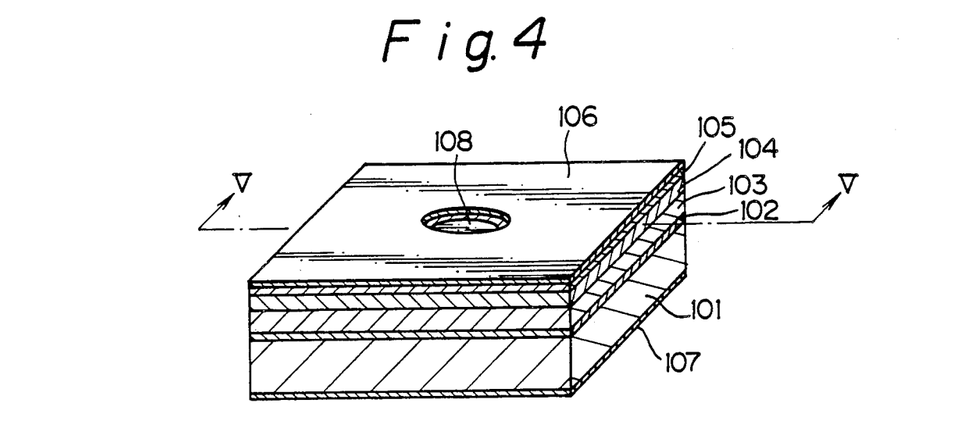
FIG. 4 is a perspective view showing a semiconductor light emitting device in accordance with an embodiment of the present invention.

Referring to FIG. 4, in an embodiment of the semiconductor light emitting device of the present invention, a semiconductor electric current blocking layer 102 of a p-type GaAs, an n-type AlGaAs layer 103, and a p-type AlGaAs layer 104 are sequentially stacked on an n-type GaAs substrate 101. The two layers 103 and 104 constitute a single hetero-junction and a light emitting portion is formed in the vicinity of a boundary face between these layers. A semiconductor electrode layer 105 of a p-type GaAs is stacked on the layer 104. A p-side electrode metallic layer 106 is formed on the semiconductor electrode layer 105. An n-side electrode metallic layer 107 is formed on the rear face of the substrate 101. As clearly seen from FIG. 5, a window 108 is disposed in the semiconductor electrode layer 105 and the p-side electrode metallic layer 106, and the bottom of the window 108 reaches the p-type AlGaAs layer 104. When an electric current flows between the electrode metallic layers 106 and 107, a light output can be provided upwards from the window 108 in a direction substantially perpendicular to the substrate 101.

Figure 5:
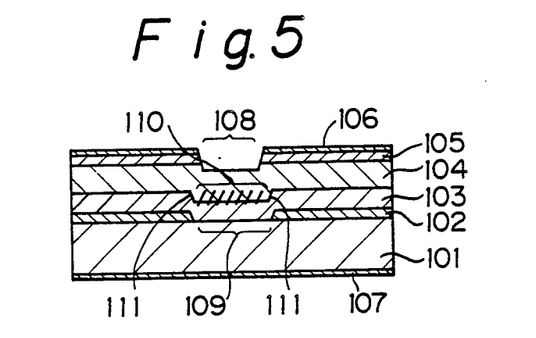
FIG. 5 is an end view showing a cross-sectional end face taken along one dotted chain line V—V of FIG. 4.
Figure 10A:
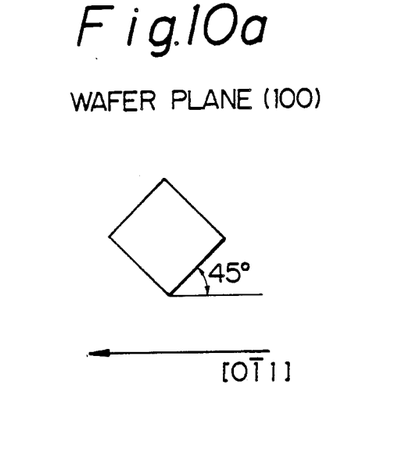
FIGS. 10a and 10b are explanatory views showing an example of a method for forming an opening in an electric current blocking layer in the above embodiments of the present invention.

As can be seen from FIG. 5, an opening 109 reaching the substrate 101 is formed in the electric current blocking layer 102 stacked on the substrate 101. As shown in FIG. 10a, for example, the opening 109 is disposed by the photolithography in a wafer on azimuth plane (100) and is formed by wet etching using an approximately square pattern substantially having angle 45° with respect to the direction [011]. The formed opening 109 is surrounded by a zone plane (100) and has a side wall approximately perpendicular to the substrate 101. The n-type AlGaAs layer 103 is epitaxially grown on the opening 109 by the MOCVD for example.

The features of the growth of the epitaxial layer 103 by the MOCVD are that the growth proceeds while a step shape of the layer 102 below the epitaxial layer 103 is held. Accordingly, the step shape of the opening 109 also appears on an upper face of the n-type AlGaAs layer 103. The p-type AlGaAs layer 104 is further formed on the layer 103 so that a single hetero-junction structure is formed on the boundary between the layers 103 and 104. The step shape of the opening 109 is also held in these layers 103 and 104.

The p-type GaAs electrode layer 105 and the p-side electrode metallic layer 106 are sequentially formed on the layer 104. Then, the window 108 is formed to reach the p-type AlGaAs layer 104. This window 108 is formed by wet etching or dry etching. The p-side electrode metallic layer 106 may be made of Au-Zn/Au for example. The n-side electrode metallic layer 107 is formed on the rear face of the substrate 101. The n-side electrode metallic layer 107 may be preferably made of Au-Ge-Ni/Au for example.

A positive side electric field is applied to the p-side electrode layer 106 and a negative side electric field is applied to the n-side electrode layer 107 and an electric current then flows between these electrodes. Since the electric current flows only through the opening 109 by the electric current blocking layer 102, the electric current concentrates in the vicinity of the boundary face 110 with respect to the single hetero-boundary face. Accordingly, a layer portion corresponding to the opening portion on the single hetero-boundary face functions as a light emitting region, and the obtained light passes through the window 108 and is emitted upwards in a direction substantially perpendicular to the substrate 101. Therefore, the emitting angle of the emitted light depends on the size of the opening 109, the size of the window 108, and the thickness of the p-type AlGaAs layer 104. For example, the emitting angle is reduced when the diameter of the window 108 is small and the thickness of the layer 104 is thick.

A boundary face 111 composed of a step is disposed between the light emitting portion 110 and a peripheral portion thereof. In particular, when the compositions of the layers 103 and 104 are different from each other, the boundary face 111 is caused in the light emitting portion and functions as a reflecting face with respect to the light transmitted in a direction substantially parallel to the substrate 101. Accordingly, the light transmitted in the transversal direction in FIG. 5 is restrained by this boundary face 111. In particular, when the thickness of the layer 103 is thinner than that of the electric current blocking layer 102 and the boundary face of the light emitting portion 110 is located below the upper face of the electric current blocking layer 102, the light generated in the transversal direction is blocked by the electric current blocking layer 102 so that the light transmission in the transversal direction is effectively restrained.

Figure 6A:
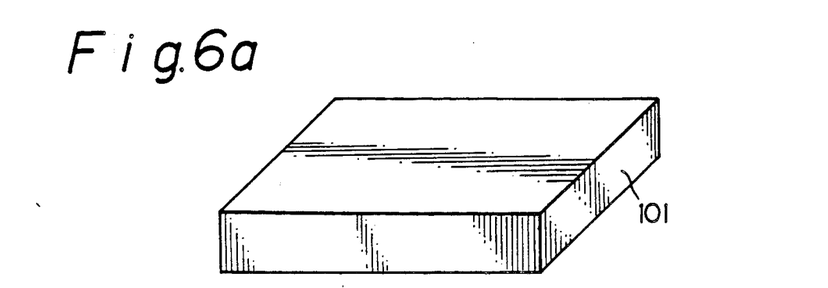
FIGS. 6a to 6d are perspective views illustrating a portion of a process for manufacturing the semiconductor light emitting device shown in FIG. 4.
Figure 6B:
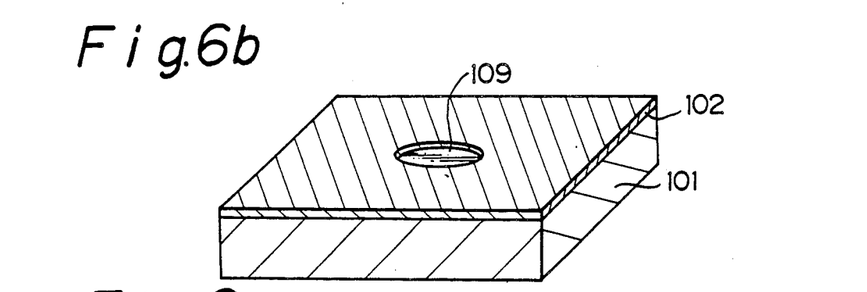
Figure 6C:
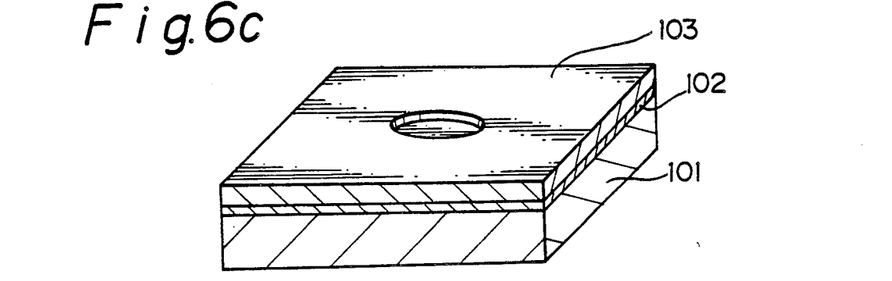
Figure 6D:
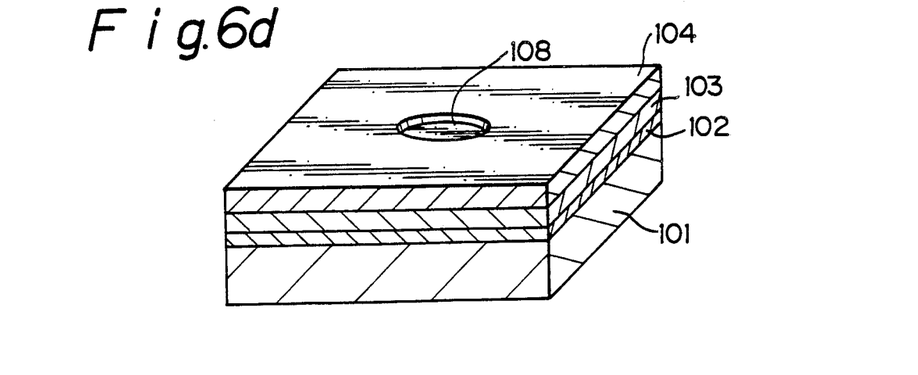

The semiconductor light emitting device shown in FIG. 4 is manufactured by the steps shown in FIGS. 6a to 6d for example. First, the n-type GaAs substrate 101 is prepared as shown in FIG. 6a. Next, as shown in FIG. 6b, the electric current blocking layer 102 of the p-type GaAs is stacked on one main face of the substrate 101, and the opening 109 reaching the substrate 101 is disposed by the above-mentioned wet etching. The above-mentioned n-type AlGaAs layer 103 and the p-type AlGaAs layer 104 are sequentially stacked on the layer 102 as shown in FIGS. 6c and 6d, respectively.

Figure 7:
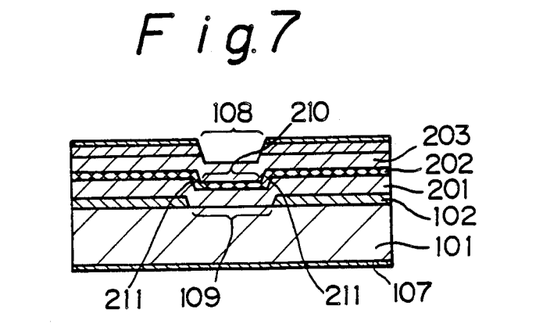
FIG. 7 is an end view showing another embodiment of the semiconductor light emitting device of the present invention and similar to FIG. 5.

In FIG. 7 showing another embodiment of the present invention, the semiconductor light emitting device has a double hetero-junction structure formed by three layers 201, 202 and 203 instead of the layers 103 and 104 constituting the single hetero-junction light emitting portion in the embodiment shown in FIG. 4. The layer 201 is constructed by n-type AlGaAs and the layer 202 is an active layer composed of AlGaAs or GaAs. The layer 203 is constructed by p-type AlGaAs. The widths of forbidden bands of the layers 201 and 203 are wider than that of the active layer 202, thereby constituting the double hetero-junction. The light emitting portion in this embodiment is a layer portion 210 corresponding to the opening 108 of the active layer 202. The light emitting efficiency is further improved by the double hetero-structure. Further, a boundary face 211 formed between the light emitting portion 210 and the active layer 202 restrains the light from the light emitting portion from being transmitted in the transversal direction.

Figure 8:
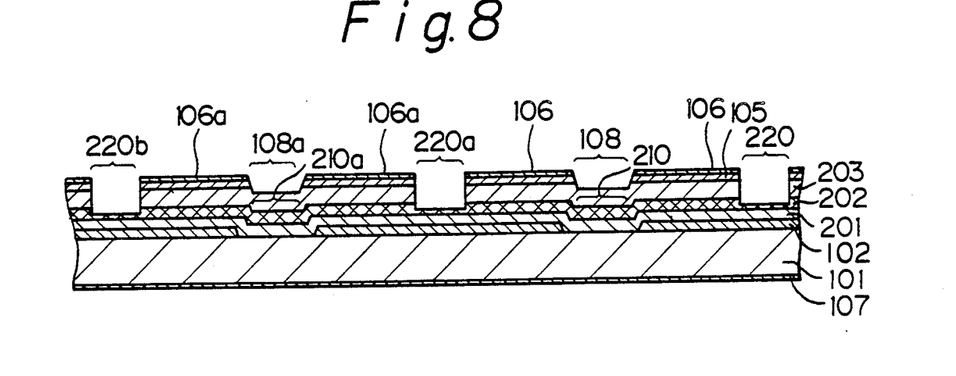
FIG. 8 is an end view showing a cross-sectional end face of arrayed elements in the semiconductor light emitting device shown in FIG. 7.

FIG. 8 is an cross-sectional end view showing arrayed elements each shown in the embodiment in FIG. 7. In FIG. 8, the same constructional portions as those in FIG. 7 are designated by the same reference numerals and the corresponding elements adjacent to each other in the array are designated by alphabets a and b. As can be seen from FIG. 8, the lights generated in light emitting portions 210 and 210a are separately taken out of respective windows 108 and 108a. In this embodiment, the electric current flows through the p-side electrodes corresponding to the respective light emitting portions, e.g., the electrode 106 with respect to the light emitting portion 210 and the electrode 106a with respect to the light emitting portion 210a. Thus, the light output is separately obtained from the light emitting portions 210 and 210a.

Grooves 220, 220a and 220b for separating the elements from each other are disposed in intermediate portions of the adjacent light emitting portions to avoid the mutual interference between the adjacent elements when the light is emitted. The depths of these grooves preferably reach until at least the layer 203 below the semiconductor electrode layer 105. In this embodiment, the depths of these grooves are formed to reach the active layer 202. These grooves prevent the electric current from flowing from the electrodes corresponding to the adjacent light emitting portions into the individual light emitting portions. Accordingly, the light emitting crosstalk between the adjacent elements is restrained.

In particular, the element separating grooves 220, 220a and 220b can be formed to have a width several $\mu$m and have a cross-sectional side wall substantially perpendicular to the substrate 101 by dry etching using a chlorine-based gas as a main material for example. In particular, in the dry etching, the widths and depths of the grooves can be independently controlled with respect to each other, which is different from the wet etching. Therefore, a light source integrated in the array of high density is formed in the dry etching. In the case of the wet etching, the shape, depth and width of the grooves on the sides thereof are restricted by the plane azimuth of the substrate 101 and the direction of the grooves. Accordingly, it is difficult to form the light source in the array in a desired direction at a desired density. The present invention can be effectively applied even when the elements shown in FIG. 4 are formed in the array.

Figure 9:
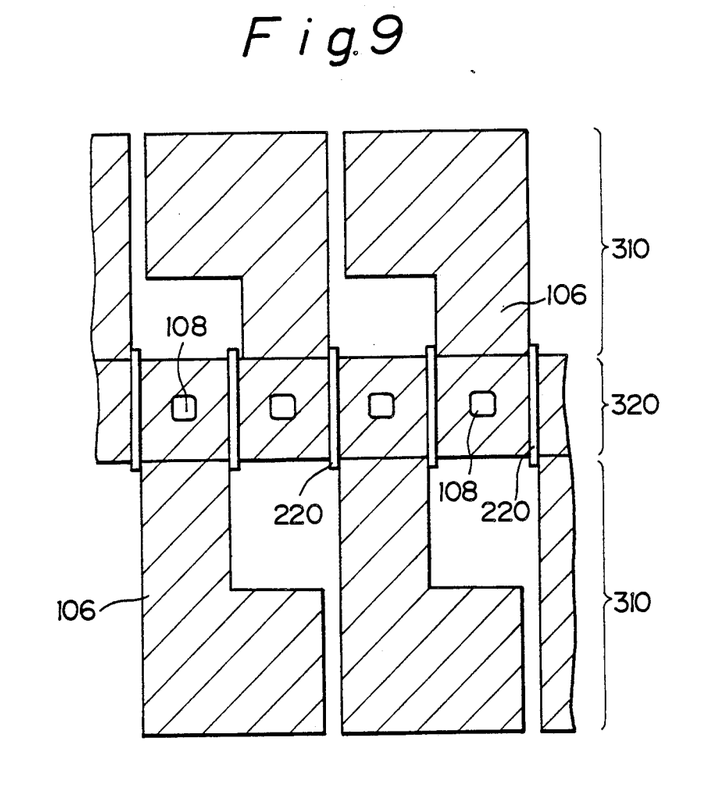
FIG. 9 is a plan view showing a portion of the semiconductor light emitting device of the present invention in which a light emitting diode is arranged in a one-dimensional array.

FIG. 9 is a plan view showing the embodiment of the present invention in which the light emitting diode is arranged in the one-dimensional array. In a region 320, preferable ohmic characteristics are held between the p-side electrode metallic layer 106 and the semiconductor electrode layer 105, and the structure is in a state in which the electric current can be flowed or injected. In contrast to this, in regions 310 on both sides of the region 320, the structure is constructed such that it is difficult to inject the electric current. This structure is provided by disposing an insulating layer such as SiO$_2$, SiN for example between the p-side electrode metallic layer 106 and the semiconductor electrode layer 105. This structure is also provided by directly exposing the p-type AlGaAs layer 203 and performing a processing for increasing the resistance on this exposed face using an H$_2$ plasma processing for example. This structure is further provided by performing a similar processing for increasing the resistance on a surface of the p-type GaAs layer 105.

In this embodiment, electrode patterns 106 with respect to the respective windows 108 are formed in an alternately symmetric shape. Grooves 220 for separating the elements are disposed over the entire width of a layer portion 320 in a direction substantially perpendicular to the direction of the array so that the elements can be completely separated from each other. The elements in the embodiment shown in FIG. 4 are also effectively applied in such a one-dimensional array structure. The flat pattern such as the electrode 106 is not limited to that shown in FIG. 9, but may be formed in another shape such as a shape extending on one side in the array direction. The length of the element separating groove 220 may be longer than that shown in FIG. 9 and may be formed in another shape such an L shape for example. The elements may be arranged in a two-dimensional array.

Figure 10B:
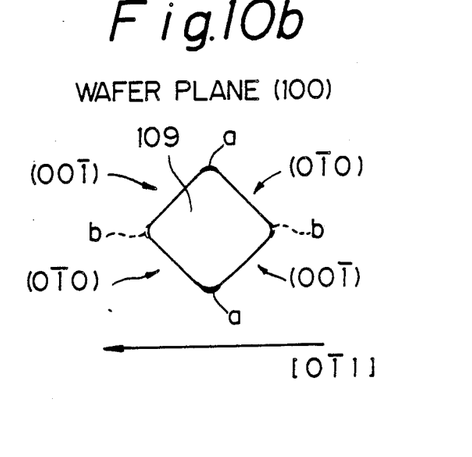

An example of a method for forming the opening 109 as a portion of the semiconductor light emitting device of the present invention will next be described. In the example shown in FIG. 10a, the square window 109 having an inclination angle 45° in the direction [011] is formed to open by the normal photolithography with respect to a wafer in which the p-type electric current blocking layer 102 having a thickness about 1 $\mu$m is stacked on the n-type GaAs substrate 101 on the azimuth plane (100). In this case, a square mask having one sides 5 $\mu$m and 10 $\mu$m is used. Thereafter, the etching operation is performed at a temperature about 2° to 10° C. using an etching liquid composed of a normal solution having a ratio of sulfuric acid:hydrogen peroxide:-water=1:8:1. Thus, the corners of the square are slightly cut as shown in FIG. 10b seen from above. One face of the square in the longitudinal direction is surrounded by the zone plane (100) and the square has a side face approximately perpendicular to the substrate 101. On the other hand, a portion a has a side face having a forward mesa shape and composed of zone plane (111), and a portion b has a side face having a backward mesa shape. The lengths of the portions a and b can be controlled by the shaping of the corners of the square mask in the photolithography and etching depth and speed, etc., and the portions a and b can be removed. The shape of the etching mask is not limited to the square, but may be a rectangular shape, a quadrilateral shape, etc.

Figure 11A:
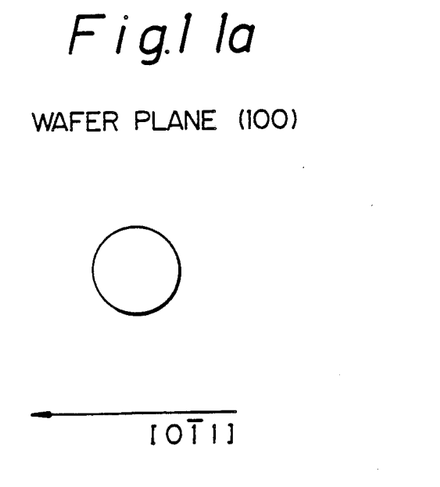
FIGS. 11a and 11b are explanatory views showing another example of the method for forming the opening in the electric current blocking layer in the above embodiments of the present invention and similar to FIGS. 10a and 10b.
Figure 11B:
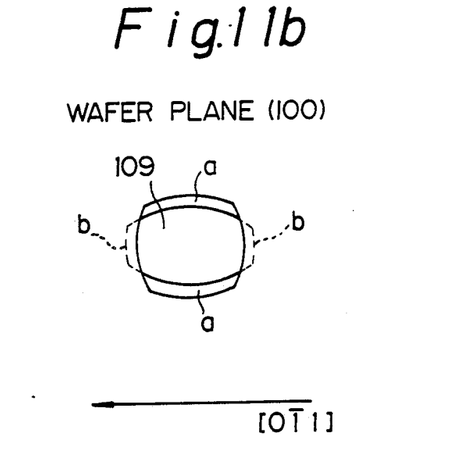

When the wet etching is performed by using a circular mask as shown in FIG. 11a, the opening 109 is formed in the shape of a side wall surrounded by a side face portion a having the forward mesa shape and a side face portion b having the backward mesa shape as shown in FIG. 11b. When the epitaxial growth is performed on the backward mesa portion b, a clearance is formed in the bottom portion of the backward mesa portion b or a disturbance is caused in the grown layer. Therefore, the backward mesa portion may be preferably reduced by the above-mentioned method described with respect to FIG. 10b.

Figure 12:
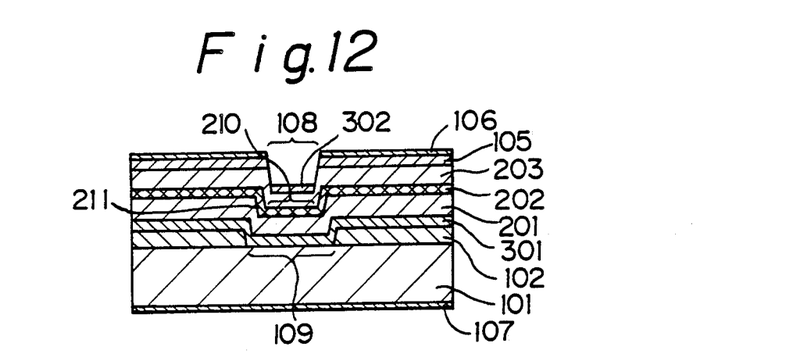
FIG. 12 is an end view showing the semiconductor light emitting device in another embodiment of the present invention and similar to FIG. 5.

FIG. 12 further shows another embodiment of the semiconductor light emitting device of the present invention. In this embodiment, a layer 301 having a so-called DBR structure is disposed between the electric current blocking layer 102 and the n-type AlGaAs layer 201 in the embodiment shown in FIG. 7. The DBR layer 301 is composed of a stacked body for example in which an AlAs layer and an AlGaAs layer are alternately stacked with each other and the thicknesses of these layers are substantially equal to one fourth a wavelength of the emitted light within a medium. This layer 301 functions as a reflecting mirror with respect to the light proceeding in the vertical direction. A layer 302 is disposed in the window portion 108 and has a structure in which e.g., gold or dielectric substances such as $SiO_2$, SiN, SnO, $TiO_2$, etc. are alternately stacked with each other. This layer 302 also functions as a reflecting mirror with respect to the light proceeding in the vertical direction. The layers 301 and 302 constitute a resonator. By such a construction, the element in this embodiment functions as a semiconductor laser. The arrayed light emitting device can be also formed in this embodiment.

In the above-mentioned embodiments of the present invention, the n-type GaAs substrate 101 is included, but the present invention can be similarly applied effectively to an example in which the p-type GaAs is used for the substrate 101. In this case, the conductivity types of the respective layers stacked on this substrate 101 are opposite to those in the above-mentioned embodiments. Another material such as InP, Gap, GaN, AlGaP, ZnSe, etc. may be used as the substrate 101. Further, the layer forming the light emitting region may be preferably made of InGaAsP, AlGaP, GaP, GaN, ZnS, ZnSe, etc.

As mentioned above, the present invention provides a semiconductor light emitting device such as a light emitting diode and a semiconductor laser suitable for the array of high density in one or two dimensions. This light emitting device provides a small size of the light emitting portion and a sufficient light output and the injecting efficiency of the electric current is high and the light emitting efficiency is high. Further, since the device has a structure supported by the substrate, the mechanical strength of the element is high. Since the crosstalk between the adjacent elements is reduced, the elements are separated from each other in a state suitable for the array of high density. Further, the angle in dispersion of the emitted light is reduced. Accordingly, the present invention provides a semiconductor light emitting device suitable for the integration of high density.

Figure 13:
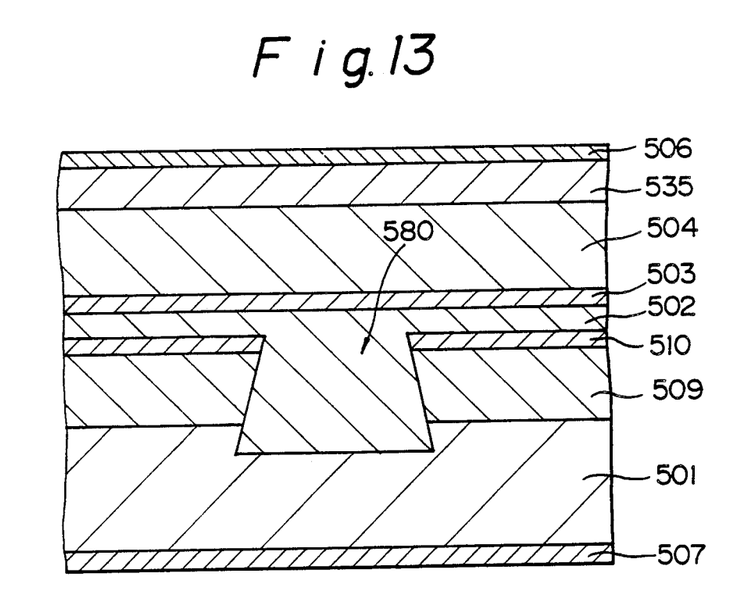
FIG. 13 is a cross-sectional view partially showing another embodiment of the semiconductor light emitting element of the present invention.

FIG. 13 is a cross-sectional view of the semiconductor light emitting element or device in another embodiment of the present invention. In the semiconductor light emitting element in this embodiment, a semi-insulating $Al_xGa_{1-x}As$ layer 509 ($0.1 < x < 0.4$) and a semi-insulating GaAs layer 510 formed by a gas phase growing method are sequentially stacked with each other on an n-type gallium arsenide (GaAs) substrate 501. A groove 580 having a mesa shape is formed in the GaAs layer 510 on a main surface side of the substrate 501, i.e., on the stacked side of the respective layers in a direction perpendicular to the substrate 501. A lower portion of the groove 580 is formed to reach the substrate 501. An n-$Al_yGa_{1-y}As$ clad layer 502 ($0.3 < y < 0.6$) is formed within the groove 580 and on the GaAs layer 510. An n-$Al_zGa_{1-z}As$ active layer 503 ($0 \leq z < 0.2$) is stacked on the clad layer 502. A p-$Al_yGa_{1-y}As$ clad layer 504 ($0.3 < y < 0.6$) is stacked on the active layer 503. A p-GaAs cap layer 535 is formed on the clad layer 504.

A p-type ohmic electrode 506 is formed on the p-GaAs cap layer 535. An n-type ohmic electrode 507 is formed on the rear face of the substrate 501, i.e., on a substrate face opposite onto the stacked side of the respective layers.

When an electric current flows through both the p-type ohmic electrode 506 and the n-type ohmic electrode 507, a light is mainly emitted within the active layer 503 in the vicinity of an upper portion of the groove 580 and is confined in the active layer 503 by the clad layers 502 and 504.

In the structure in this embodiment, the semiinsulating $Al_xGa_{1-x}As$ layer 509 ($0.1 < x < 0.4$) is formed on the substrate 501 by the gas phase growing method so that the injecting efficiency of the electric current to a active region is improved. The thickness of the layer from the active layer to the surface of the stacked portion can be formed to be thin so that the heat-radiating efficiency is improved and the light emitting efficiency is prevented from being reduced by the increase in temperature in the active region, thereby providing a high light emitting output.

In this embodiment, the semi-insulating GaAs is used for the GaAs layer 510 but an n-type or p-type GaAs can be used for the layer 510. When effects as an electric current blocking layer are given to the GaAs layer 510, it is desirable to use the p-type or semiinsulating GaAs.

Figure 14:
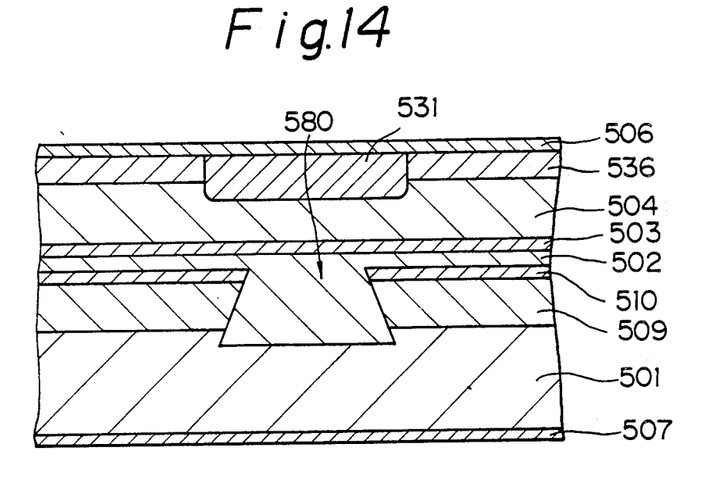
FIGS. 14 and 15 are cross-sectional views partially showing another embodiment of the semiconductor light emitting element of the present invention.

FIG. 14 is a cross-sectional view showing another embodiment of the semiconductor light emitting element of the present invention. In the semiconductor light emitting element in this embodiment, a cap layer 535 composed of an n-type GaAs or undoped GaAs is formed instead of the p-GaAs cap layer 535 formed on the p-$Al_yGa_{1-y}As$ clad layer 504 in the embodiment shown in FIG. 13. A Zn diffusion region 531 is formed in this cap layer 536 and reaches the clad layer 504 from a surface of the cap layer 536.

In this semiconductor light emitting element, the electric current concentrating structure is formed in an upper portion of the stacked portion. Accordingly, when the electric current flows between the p-type ohmic electrode 506 and the n-type ohmic electrode 507, the injecting efficiency of the electric current is further improved with respect to an active region as a layer portion aligning with the groove 580 of the active layer 503.

Figure 15:
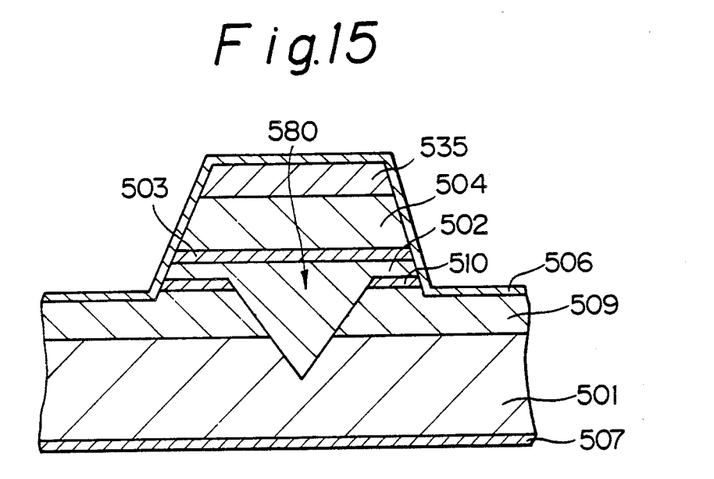

FIG. 15 is a cross-sectional view showing another embodiment of the semiconductor light emitting element of the present invention. In this embodiment, a semiinsulating GaAs layer 510, an n-$Al_yGa_{1-y}As$ clad layer 502, an active layer 503, a p-$Al_yGa_{1-y}As$ clad layer 504, and a p-GaAs cap layer 535 are formed in an upper portion of the semi-insulating $Al_xGa_{1-x}As$ layer 509 of the element having the stacked structure in FIG. 13 and are further formed only in a layer portion aligning with an upper portion of a groove 580. A p-type ohmic electrode 506 is formed on an upper face of the stacked portion, on a side face of the stacked portion, and in the upper portion of the semi-insulating $Al_xGa_{1-x}As$ layer 509 except for the stacked portion. Namely, the semiconductor light emitting element in this embodiment has a structure in which the striped stacked portion corresponding to the groove 580 is left and the other stacked portion is removed until the semi-insulating $Al_xGa_{1-x}As$ layer 509.

In the structure in this embodiment, the stacked portion above the layer 509 is formed in only the upper portion of the groove 580. Accordingly, when the electric current flows through both the p-type ohmic electrode 506 and the n-type ohmic electrode 507, there is no dispersion of the electric current in the transversal direction in the upper portion of the active layer 503, thereby improving the injecting efficiency of the electric current to the active layer.

Figure 16A:
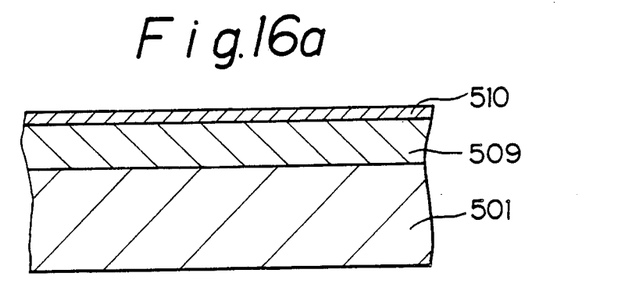
FIGS. 16a to 16c are cross-sectional views showing an example of a manufacturing process of the semiconductor light emitting element shown in FIG. 13.
Figure 16B:
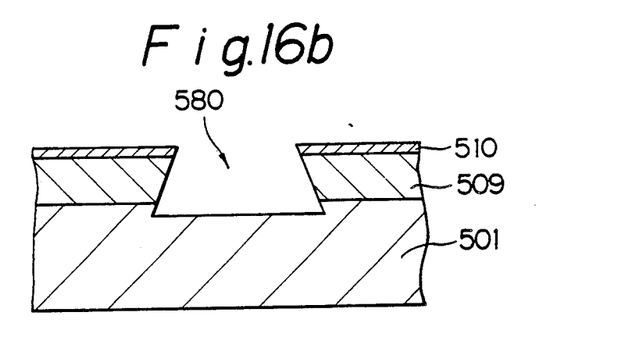
Figure 16C:
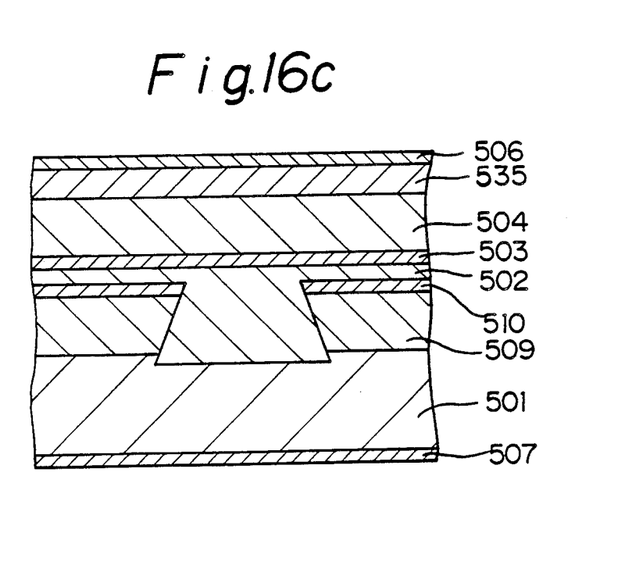

FIGS. 16a to 16c show an embodiment of a manufacturing process of the basic elements in the embodiment of the present invention shown in FIG. 13.

In FIG. 16a, the semi-insulating $Al_xGa_{1-x}As$ layer 509 ($0.1<x<0.4$) and the semi-insulating GaAs layer 510 are grown on the n-GaAs substrate 501 by the gas phase growing method. A halide gas and an organic metal can be used in the gas phase growing method.

Next, as shown in FIG. 16b, the groove 580 is formed by photolithography and etching to reach the n-GaAs substrate 501 from the surface of the GaAs layer 510. In this case, various kinds of etching methods such as a reactive ion etching, an etching by ECR plasma, or a chemical etching, etc., can be used. For example, when the chemical etching method is used and an etchant having a volume ratio $H_2SO_4:H_2O_2:H_2O = 1:8:1$ is used and the etching is performed at a temperature about 5° C. for about one minute, the groove 580 having an etching depth about 2.5 $\mu$m can be formed. The groove 580 having the forward or backward mesa shape can be formed depending on the direction of a mask arranged in the etching processing. However, in the structure of the semiconductor light emitting element in the present invention, there are no special problems with respect to the shape of the groove 580. Namely, in this embodiment, it is sufficient to form the groove 580 such that the lower portion of the groove 580 extends through the semi-insulating $Al_xGa_{1-x}As$ layer 509 and the semi-insulating GaAs layer 510 and reaches the n-GaAs substrate 501.

Next, the n-$Al_yGa_{1-y}As$ clad layer 502 ($0.3<y<0.6$) is grown on the upper face of the GaAs layer 510 and inside the groove 580 by a liquid phase epitaxial growing method. Further, by this growing method, the active layer 503 is grown on the clad layer 502 and the p-$Al_yGa_{1-y}As$ clad layer 504 ($0.3<y<0.6$) is grown on the active layer 503 and further the p-GaAs cap layer 535 is grown on the clad layer 504. Thereafter, the p-type ohmic electrode 506 is formed on the p-GaAs cap layer 535 and the n-type ohmic electrode 507 is then formed on the rear face of the substrate 501, i.e., on the substrate face opposite onto the stacked side of the respective layers as shown in FIG. 16c. The light emitting element can next be obtained by cutting out of the wafer by cleavage.

In this embodiment, the thickness of the semi-insulating $Al_xGa_{1-x}As$ layer 509 is preferably about 1 to 1.5 $\mu$m, and the thickness of the semi-insulating GaAs layer 510 is preferably about 0.5 $\mu$m. The width of the groove 580 is preferably a width less than about 5 $\mu$m.

In the semiconductor light emitting element of the present invention shown in FIGS. 13 to 16, the semi-insulating layer 509 is formed by the gas phase growing method as the electric current concentrating layer. Accordingly, a very uniform layer can be preferably obtained in the manufacturing process of the element and a high electrical resistivity is obtained, thereby providing a semi-insulating layer having excellent characteristics in comparison with the liquid phase growing method. Therefore, the etching processing in the manufacturing process of the element can be performed irrespective of the change in thickness of the layer by the position of the layer grown on the substrate so that it is easy to control the etching processing.

In comparison with the general MEIS type semiconductor element, the semi-insulating layer 509 as the electric current concentrating layer can be grown as a very thin layer having a thickness less than about 2 $\mu$m and is formed on the substrate side. Therefore, for example, when the growing side of the respective layers is joined to a heat sink, the thickness of the layer from the active layer to the upper face of the stacked portion can be set to a thickness about 1.5 $\mu$m, thereby providing an element having excellent heat-radiating characteristics.

In the elements shown in FIGS. 13 and 14, the GaAs layer 510 formed in the upper portion of the semi-insulating layer 509 prevents the oxidation of the semi-insulating layer 509 of an i-type for example. Further, a loss region with respect to the light generated in the active layer 503 is located on both sides of the groove 580, thereby enabling the operation of the light emitting element in a stable single mode.

As mentioned above, in accordance with the present invention, the semi-insulating layer is formed by the gas phase growing method as the electric current concentrating layer on the main surface side of the substrate so that the injecting efficiency of the electric current to the active region is improved. Further, since the thickness of the layer from the active layer to the surface of the stacked portion can be formed to be thin, the heat-radiating efficiency is improved and the light emitting efficiency can be prevented from being reduced by the increase in temperature in the active region. Thus, the semiconductor light emitting element of the present invention can provide a high light emitting output.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor light emitting device comprising:
   a semiconductor substrate of a first conductivity type having an azimuth plane (100);
   an electric current blocking layer stacked on one main face of said substrate and including a semiconductor of a second conductivity type opposite to the first conductivity type;
   an opening formed in said electric current blocking layer by wet etching through a substantially square mask substantially inclined by 45° with respect to a direction [011] so as to reach said one main face of said substrate and mainly defined by a side face surrounded by a face approximately composed of a zone plane (100);
   a first semiconductor layer of the first conductivity type stacked on said electric current blocking layer and a portion of said one main face of said substrate on which said opening is formed;
   a second semiconductor layer stacked on said first semiconductor layer and forming a hetero-junction together with said first semiconductor layer;
   a semiconductor layer for electrode of the second conductivity type stacked on said second semiconductor layer;
   a window formed in said semiconductor layer for electrode so as to correspond to said opening and to reach said second semiconductor layer, said window being formed in a flat shape composed of a substantially circular or rectangular shape, a size of said window being substantially less than that of said opening;

a first electrode metallic layer formed on said semiconductor layer for electrode except said window; and a second electrode metallic layer formed on another main face of said substrate;

said opening being formed in such a manner that portions of said first semiconductor layer and said second semiconductor layer corresponding to said opening function as a light emitting region and a light generated from the light emitting region is outputted through said window in a direction substantially perpendicular to said semiconductor substrate when an electric current flows between said first electrode metallic layer and said second electrode metallic layer through said opening.

2. A semiconductor light emitting device according to claim 1, in which said second semiconductor layer comprises a single semiconductor layer and forms a single hetero-junction together with said first semiconductor layer.

3. A semiconductor light emitting device according to claim 1, in which said second semiconductor layer comprises two semiconductor layers stacked with each other and forms a double hetero-junction together with said first semiconductor layer.

4. A semiconductor light emitting device according to claim 1, in which the device is arranged in a one or two-dimensional array and a groove for separating elements from each other is formed by dry etching in an intermediate portion of the adjacent light emitting regions and has a wall substantially perpendicular to said substrate.

5. A semiconductor light emitting device according to claim 1, in which said electric current blocking layer, said first semiconductor layer and said second semiconductor layer are formed while a step shape of said opening is substantially held.

* * * * *

UNITED STATES PATENT AND TRADEMARK OFFICE
CERTIFICATE OF CORRECTION

PATENT NO. : 4,990,972

DATED : Feb. 5, 1991

INVENTOR(S) : Shiro SATOH and Noriaki ONODERA

It is certified that error appears in the above-identified patent and that said Letters Patent is hereby corrected as shown below:

Title page, left-hand column, item "[73]* should read:

-- [73] Assignee: Ricoh Company, Ltd., Tokyo, Japan, and Ricoh Research Institute of General Electronics Co., Ltd., Miyagi-ken, Japan--.

Signed and Sealed this

Fifth Day of January, 1993

Attest:

DOUGLAS B. COMER

*Attesting Officer*     *Acting Commissioner of Patents and Trademarks*